(12) United States Patent
Hong

(10) Patent No.: US 8,552,633 B2
(45) Date of Patent: Oct. 8, 2013

(54) PIXEL ARRANGEMENT STRUCTURE FOR ORGANIC LIGHT EMITTING DIODE DISPLAY

(75) Inventor: Jae-Min Hong, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/536,530

(22) Filed: Jun. 28, 2012

(65) Prior Publication Data

US 2013/0113363 A1    May 9, 2013

(30) Foreign Application Priority Data

Nov. 3, 2011   (KR) .................. 10-2011-0114027

(51) Int. Cl.
  *H01J 1/62*     (2006.01)
(52) U.S. Cl.
  USPC .......................................... 313/498; 313/504

(58) Field of Classification Search
  USPC ........................................ 313/461, 498, 504
  See application file for complete search history.

(56) References Cited

U.S. PATENT DOCUMENTS 6,838,819 B2 * 1/2005 Kim et al. ..................... 313/505

FOREIGN PATENT DOCUMENTS

| JP | 2004-347930 | 12/2004 |
| KR | 10-1993-0022125 | 11/1993 |
| KR | 10-1015332 | 2/2011 |

* cited by examiner

*Primary Examiner* — Vip Patel
(74) *Attorney, Agent, or Firm* — Robert E. Bushnell, Esq.

(57) ABSTRACT

A pixel arrangement structure for an organic light emitting diode display includes a first pixel, a second pixel and a third pixel. The first pixel has a larger area than the second pixel and the third pixel, and the first pixel, the second pixel and the third pixel have different planar shapes relative to each other.

10 Claims, 2 Drawing Sheets

PIXEL ARRANGEMENT STRUCTURE FOR ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on the 3 Nov. 2011 and there duly assigned Ser. No. 10-2011-0114027.

BACKGROUND OF THE INVENTION

1. Field of the Invention

The present invention relates generally to a pixel arrangement structure for an organic light emitting diode display, and more particularly, to a pixel arrangement structure for an organic light emitting diode display in which a plurality of pixels emit light to display an image.

2. Description of the Related Art

As a display device which displays an image, an organic light emitting diode (OLED) display has come into the spotlight in recent years.

The OLED display, unlike a liquid crystal display (LCD) device, has a self-luminous characteristic and does not need a separate light source, thereby reducing its thickness and its weight. Furthermore, the OLED display exhibits high-quality characteristics such as low power consumption, high luminance, and a high reaction speed.

In general, the OLED display includes a plurality of pixels for emitting light of different colors relative to each other, and the plurality of pixels emit light to display an image.

The pixels of the OLED display of the related art are arranged to have the same shape and size. Since each of the pixels includes an organic layer emitting light of a different color, the organic layers emitting light of different colors are different in lifespan, which leads to a reduction in the lifespan of the entire OLED display.

Recently, in order to solve this problem, the pixels are arranged by forming one pixel, including an organic layer having a relative short lifespan relative to the other organic layers among the organic layers emitting light of different colors, to be larger than the other pixels, but gaps between the one pixel and the other pixels increase, whereby the entire aperture ratio of the OLED display is reduced.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention has been developed in an effort to provide a pixel arrangement structure for an organic light emitting diode display having advantages of minimizing a decrease in the overall aperture ratio while considering a lifespan of an organic layer.

An exemplary embodiment of the invention provides a pixel arrangement structure for an organic light emitting diode display, including: a first pixel, a second pixel, and a third pixel which are positioned adjacent to each other, in which the first pixel has a larger area than the second pixel and the third pixel, and in which the first pixel, the second pixel and the third pixel have different planar shapes relative to each other.

The first pixel, the second pixel, and the third pixel may emit light of different respective colors.

The first pixel, the second pixel, and the third pixel may emit blue light, green light, and red light, respectively.

A first side of the second pixel facing one side of the first pixel may be longer than a second side of the second pixel adjacent to the first side of the second pixel.

A third side of the third pixel facing one side of the first pixel may be longer than a fourth side of the third pixel adjacent to the third side of the third pixel.

The second pixel and the third pixel may be alternately arranged with respect to the first pixel so as to surround the first pixel.

The first pixel may have a hexagonal shape and the second pixel and the third pixel may have hexagonal shapes which are symmetrical relative to each other.

The first pixel may have a hexagonal shape and the second pixel and the third pixel may have pentagonal shapes which are symmetrical relative to each other.

The first pixel, the second pixel and the third pixel may be provided in plural, the second pixel and the third pixel may be positioned between the adjacent first pixels arranged on a first imaginary line, and a portion of each of the second pixel and the third pixel may be positioned between the adjacent first pixels arranged on a second imaginary line crossing the first imaginary line.

The first pixel, the second pixel, and the third pixel may have a triangular shape.

According to exemplary embodiments of the invention, the pixel arrangement structure for an organic light emitting diode display minimizes a decrease in the overall aperture ratio while considering a lifespan of an organic layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
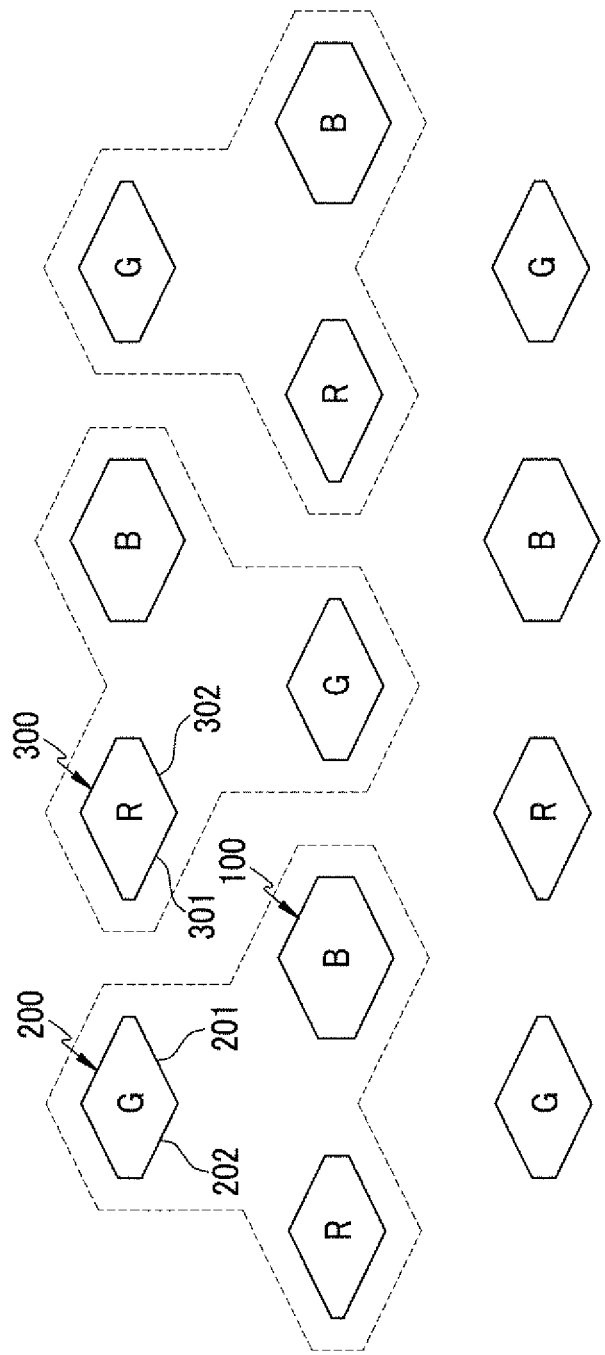
FIG. 1 is a view showing a pixel arrangement structure for an organic light emitting diode display according to a first exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification.

Furthermore, the same constituent elements in exemplary embodiments are denoted by the same reference numerals and will be described representatively in a first exemplary embodiment, and only configurations different from those of the first exemplary embodiment will be described in the other exemplary embodiments.

The size and thickness of components shown in the drawings may be arbitrarily illustrated herein for better understanding and ease of description, and the present invention is not limited thereto.

In the drawings, the thicknesses of layers, films, panels, regions, etc. are exaggerated for clarity. Furthermore, in the drawings, the thicknesses of some layers, films, panels, regions, etc. are exaggerated for better understanding and ease of description. It will be understood that, when an element such as a layer, film, region, or substrate is referred to as being "on" another element, it can be directly on the other element or intervening elements may also be present.

Furthermore, in the specification, unless explicitly described to the contrary, the word "comprise" and variations such as "comprises" or "comprising" will be understood to imply the inclusion of stated elements but not the exclusion of any other elements. Moreover, it will be understood that, when an element is referred to as being positioned "on", it can be positioned "on" or "below" a target portion, not necessarily being positioned at an upper side with respect to a gravity direction.

Hereinafter, a pixel arrangement structure for an organic light emitting diode display according to a first exemplary embodiment will be described with reference to FIG. 1.

FIG. 1 is a view showing a pixel arrangement structure for an organic light emitting diode display according to a first exemplary embodiment of the invention. More specifically, FIG. 1 is a view schematically showing a portion of pixels constituting an organic light emitting diode display.

As shown in FIG. 1, the pixel arrangement structure for an organic light emitting diode display according to the first exemplary embodiment includes a plurality of first pixels 100, a plurality of second pixels 200, and a plurality of third pixels 300. The first pixel 100, the second pixel 200, and the third pixel 300 are arranged in a triangular shape within a dotted line as shown in FIG. 1, but they are not limited thereto, and they may be arranged in a quadrangular shape, a pentagonal shape, or the like.

Herein, the pixel refers to a minimum unit for displaying an image.

Furthermore, among the first pixel 100, the second pixel 200, and the third pixel 300, power lines for driving each of the pixels, such as a gate line, a data line, a driving power line, and the like, and an insulation layer such as a pixel defined layer for defining each of the pixels, may be disposed. In addition, an organic light emitting diode, including an anode, an organic emission layer, and a cathode to correspond to each of the first pixel 100, the second pixel 200, and the third pixel 300, may be disposed. These configurations are known in the art, and a description thereof is omitted for ease of description. The shape of each of the pixels may be defined by the power lines, the pixel defined layer, or the anode, or the like, but is not limited thereto.

The first pixel 100 has a first size larger than the sizes of the second pixel 200 and the third pixel 300 which are adjacent to the first pixel 100, and the first pixel 100 has a hexagonal shape. The first pixel 100 is provided in plural, and the first pixels 100 are arranged so as to be spaced apart from each other. The first pixel 100 emits blue light and has the first size larger than the sizes of the second pixel 200 and the third pixel 300 considering a lifespan of an organic emission layer emitting blue light, thereby improving the entire lifespan of the organic light emitting diode display.

The second pixel 200 is positioned adjacent to the first pixel 100.

The second pixel 200 has a second size smaller than the first size of the first pixel 100, and the second pixel 200 has a hexagonal shape. The second pixel 200 is provided in plural, and the second pixels 200 are arranged so as to be spaced apart from each other. The second pixel 200 emits green light. A first side 201 adjacent to the first pixel 100, among a plurality of sides constituting the hexagonal shape of the second pixel 200, is longer than a second side 202 adjacent to the first side 201 so as to face one side constituting the hexagonal shape of the first pixel 100. For this reason, the first side 201 of the second pixel 200 is formed to have a length corresponding to the one side of the first pixel 100 so that a gap between the first pixel 100 and the second pixel 200 is minimized.

The third pixel 300 is positioned adjacent to the second pixel 200, and the second pixel 200 and the third pixel 300 are mutually alternately arranged with respect to the first pixel 100 so as to surround the first pixel 100.

The third pixel 300 has a third size smaller than the first size of the first pixel 100 and has a hexagonal shape which is symmetrical to the hexagonal shape of the adjacent second pixel 200. Herein, the third size may be equal to or different from the aforementioned second size. The third pixel 300 is provided in plural, and the third pixels 300 are arranged to be spaced apart from each other. The third pixel 300 emits red light. A third side 301 adjacent to the first pixel 100, among a plurality of sides constituting the hexagonal shape of the third pixel 300, is longer than a fourth side 302 adjacent to the third side 301 so as to face one side constituting the hexagonal shape of the first pixel 100. For this reason, the third side 301 of the third pixel 300 is formed to have a length corresponding to one side of the first pixel 100 so that a gap between the first pixel 100 and the third pixel 300 is minimized.

As described above, even though each of the first pixel 100, the second pixel 200, and the third pixel 300 has the hexagonal shape, the first pixel 100 has the first size larger than the sizes of the second pixel 200 and the third pixel 300 so as to have a larger area than the second pixel 200 and the third pixel 300, the first side 201 of the second pixel 200 is longer than the second side 202, the third side 301 of the third pixel 300 is longer than the fourth side 302, and the second pixel 200 and the third pixel 300 have shapes symmetrical with respect to each other. Therefore, the first pixel 100, the second pixel 200 and the third pixel 300 have different planar shapes relative to each other.

As described above, in the pixel arrangement structure for an organic light emitting diode display according to the first exemplary embodiment, the first pixel 100 emitting the blue light, which has a short lifespan relative to the other pixels among the first pixel 100, the second pixel 200, and the third pixel 300, has a larger area than the second pixel 200 and the third pixel 300, thereby preventing the entire lifespan of the organic light emitting diode display from being shortened. That is, a pixel arrangement structure for an organic light emitting diode display with an improved lifespan is provided in accordance with the invention.

Furthermore, in the organic light emitting diode display according to the first exemplary embodiment, even though the first pixel 100 is formed so as to have a first size larger than the sizes of the second pixel 200 and the third pixel 300 considering the lifespan, the first side 201 of the second pixel 200 and the third side 301 of the third pixel 300, which are adjacent to the first pixel 100, correspond to the sides constituting the hexagonal shape of the first pixel 100, respectively. Thus, they are formed so as to be longer than the second side 202 of the second pixel 200 and the fourth side 302 of the third pixel 300, respectively, so that the gap between the first pixel 100 and the second pixel 200 and the gap between the first pixel 100 and the third pixel 300 are minimized, thereby minimizing a decrease in the entire aperture ratio of the organic light emitting diode display.

As described above, in the pixel arrangement structure for an organic light emitting diode display according to the first exemplary embodiment, the first pixel 100, the second pixel 200 and the third pixel 300 do not have simply different planar shapes relative to each other, but even though the pixel arrangement structure is configured so that the first pixel 100 has the first size larger than the sizes of the second pixel 200 and the third pixel 300 considering a reduction in lifespan of the first pixel 100 emitting the blue light, the first side 201 of the second pixel 200 and the third side 301 of the third pixel 300 are long so as to correspond to the sides of the first pixel 100 and so as to minimize increases in the gap between the first pixel 100 and the second pixel 200 and increases in the gap between the first pixel 200 and the third pixel 300 due to a difference in size, thereby minimizing reduction in the entire lifespan of the organic light emitting diode display and minimizing decrease in the overall aperture ratio. That is, in the pixel arrangement structure for an organic light emitting diode display according to the first exemplary embodiment, the first pixel 100, the second pixel 200 and the third pixel 300 have different planar shapes relative to each other considering reduction in lifespan of the organic light emitting diode display and decrease in the aperture ratio.

Meanwhile, in the pixel arrangement structure for an organic light emitting diode display according to the first exemplary embodiment, the first pixel 100, the second pixel 200 and the third pixel 300 emit the blue light, the green light and the red light, respectively, but a pixel arrangement structure for an organic light emitting diode display according to another exemplary embodiment is not limited thereto, and the first pixel, the second pixel and the third pixel may emit light of different colors relative to each other. For example, at least one of the second pixel and the third pixel may emit white light or the like.

Hereinafter, a pixel arrangement structure for an organic light emitting diode display according to a second exemplary embodiment will be described with reference to FIG. 2.

Figure 2:
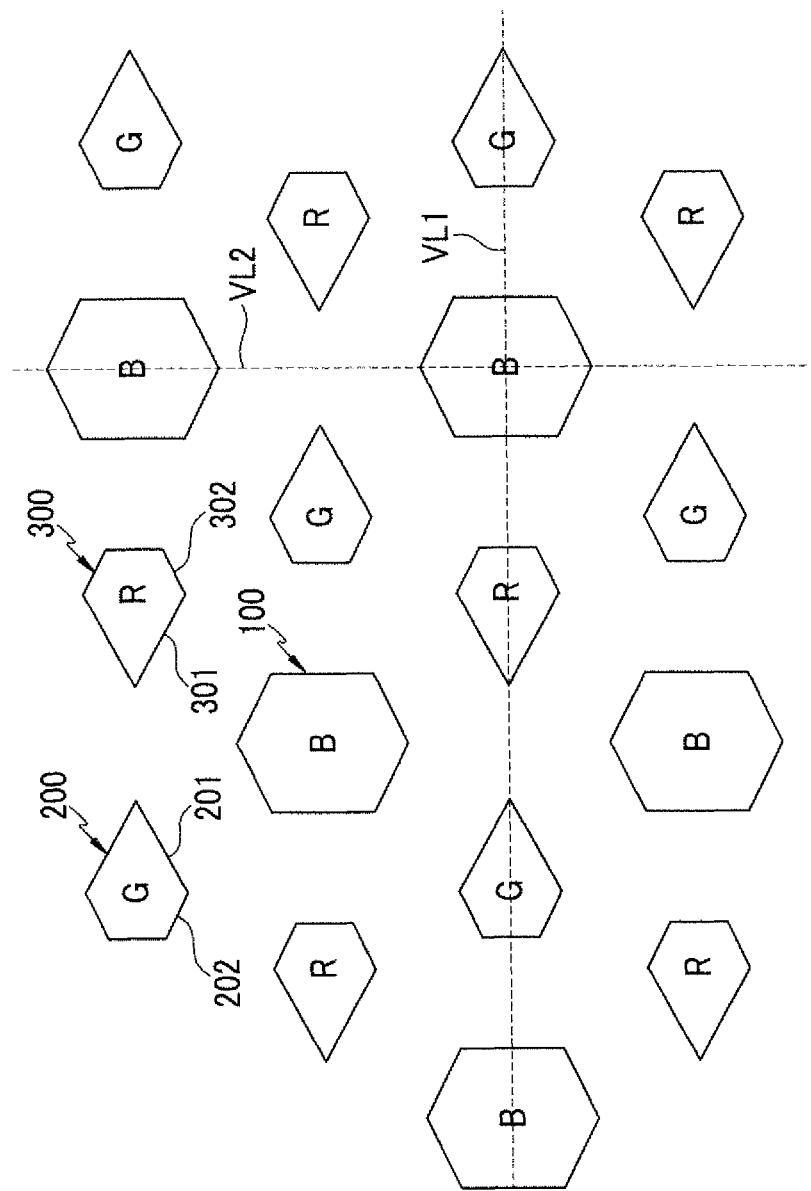
FIG. 2 is a view showing a pixel arrangement structure for an organic light emitting diode display according to a second exemplary embodiment of the invention.

FIG. 2 is a view showing a pixel arrangement structure for an organic light emitting diode display according to a second exemplary embodiment of the invention.

Hereinafter, only characteristic parts distinguishable from the first exemplary embodiment are selectively described, and the description of other parts from the first exemplary embodiment is omitted. In the second exemplary embodiment, for better comprehension and ease of description, the same constituent elements are designated by the same reference numerals as in the first exemplary embodiment.

As shown in FIG. 2, the pixel arrangement structure for an organic light emitting diode display according to the second exemplary embodiment includes a first pixel 100, a second pixel 200 and a third pixel 300, each of which has a different planar shape relative to the others. The second pixel 200 and the third pixel 300 are positioned between adjacent first pixels 100 which are arranged on a first imaginary line VL1, and a portion of each of the second pixel 200 and the third pixel 300 is positioned between adjacent first pixels 100 which are arranged on a second imaginary line VL2 crossing the first imaginary line VL1. Herein, the first imaginary line VL1 and the second imaginary line VL2 may be vertical relative to each other but are not limited thereto, and the first imaginary line VL1 and the second imaginary line VL2 may form an acute angle or an obtuse angle.

The first pixel 100 has a first size larger than the sizes of the second pixel 200 and the third pixel 300, which are adjacent to the first pixel 100, and the first pixel 100 has a hexagonal shape.

The second pixel 200 is positioned adjacent to the first pixel 100.

The second pixel 200 has a second size smaller than the first size of the first pixel 100 and has a pentagonal shape. The second pixel 200 is provided in plural, and the second pixels 200 are arranged so as to be spaced apart from each other. The second pixel 200 emits green light. A first side 201 adjacent to the first pixel 100, among a plurality of sides constituting the pentagonal shape of the second pixel 200, is longer than a second side 202 adjacent to the first side 201 so as to face a side constituting the hexagonal shape of the first pixel 100. For this reason, the first side 201 of the second pixel 200 is formed to have a length corresponding to the side of the first pixel 100, thereby minimizing a gap between the first pixel 100 and the second pixel 200.

The third pixel 300 is positioned adjacent to the second pixel 200, and the second pixel 200 and the third pixel 300 are alternately arranged with respect to the first pixel 100 so as to surround the first pixel 100.

The third pixel 300 has a second size smaller than the first size of the first pixel 100 and has a pentagonal shape symmetrical to the pentagonal shape of the adjacent second pixel 200. The third pixel 300 is provided in plural, and the third pixels 300 are arranged so as to be spaced apart from each other. The third pixel 300 emits red light. A third side 301 adjacent to the first pixel 100, among a plurality of sides constituting the pentagonal shape of the third pixel 300, is longer than a fourth side 302 adjacent to the third side 301 so as to face another side constituting the hexagonal shape of the first pixel 100. For this reason, the third side 301 of the third pixel 300 is formed so as to have a length corresponding to the side of the first pixel 100, thereby minimizing a gap between the first pixel 100 and the third pixel 300.

As described above, even though the first pixel 100 has the hexagonal shape and the second pixel 200 and the third pixel 300 have the pentagonal shapes symmetrical to each other, the first pixel 100 has the first size larger than the sizes of the second pixel 200 and the third pixel 300, the first side 201 of the second pixel 200 is formed longer than the second side 202, the third side 301 of the third pixel 300 is formed longer than the fourth side 302, and the second pixel 200 and the third pixel 300 have shapes symmetrical to each other, so that the first pixel 100, the second pixel 200, and the third pixel 300 have different planar shapes relative to each other.

As described above, in the pixel arrangement structure for an organic light emitting diode display according to the second exemplary embodiment, the first pixel 100 emitting the blue light, which has the short lifespan relative to the other pixels, among the first pixel 100, the second pixel 200, and the third pixel 300, has a larger area than the second pixel 200 and the third pixel 300, so that it is possible to prevent the entire lifespan of the organic light emitting diode display from being shortened. That is, the pixel arrangement structure for an organic light emitting diode display with improved lifespan is provided.

Furthermore, in the organic light emitting diode display according to the second exemplary embodiment, even though the first pixel 100 is formed to have the first size larger than the sizes of the second pixel 200 and the third pixel 300 considering the lifespan, the first side 201 of the second pixel 200 and the third side 301 of the third side 300, which are adjacent to the first pixel 100, correspond to the sides constituting the hexagonal shape of the first pixel 100, respectively, and thus, the first side 201 and the third side 301 are formed longer than the second side 202 of the second pixel 200 and the fourth side 302 of the third pixel 300 so that the gap between the first pixel 100 and the second pixel 200, and the gap between the first pixel 100 and the third pixel 300, are minimized, thereby minimizing a decrease in the entire aperture ratio of the organic light emitting diode display.

As described above, in the pixel arrangement structure for an organic light emitting diode display according to the second exemplary embodiment, the first pixel 100, the second pixel 200 and the third pixel 300 do not have simply different planar shapes relative to each other. However, even though the pixel arrangement structure is configured so that the first pixel 100 has the first size larger than the sizes of the second pixel 200 and the third pixel 300 considering the reduction in lifespan of the first pixel 100 emitting the blue light, the first side 201 of the second pixel 200 and the third side 301 of the third pixel 300 are formed long so as to correspond to the sides of the first pixel 100 and so as to minimize increases in the gap between the first pixel 100 and the second pixel 200 and the gap between the first pixel 100 and the third pixel 300 due to a difference in size, thereby minimizing the reduction in the entire lifespan of the organic light emitting diode display and minimizing the decrease in the entire aperture ratio. That is, in the pixel arrangement structure for an organic light emitting diode display according to the second exemplary embodiment, the first pixel 100 has the hexagonal shape and the second pixel 200 and the third pixel 300 have the pentagonal shapes considering the reduction in lifespan of the organic light emitting diode display and the decrease in the aperture ratio. As a result, the first pixel 100, the second pixel 200, and the third pixel 300 have different planar shapes relative to each other.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A pixel arrangement structure for an organic light emitting diode display, comprising:
    a first pixel, a second pixel and a third pixel which are positioned adjacent to each other, the first pixel having a larger area than the second pixel, the first pixel having a larger area than the third pixel, and the first pixel the second pixel and the third pixel having different planar shapes relative to each other.

2. The pixel arrangement structure for an organic light emitting diode display of claim 1, wherein the first pixel, the second pixel and the third pixel emit light of different colors, respectively.

3. The pixel arrangement structure for an organic light emitting diode display of claim 2, wherein the first pixel, the second pixel and the third pixel emit blue light, green light and red light, respectively.

4. The pixel arrangement structure for an organic light emitting diode display of claim 1, wherein a first side of the second pixel facing one side of the first pixel is longer than a second side of the second pixel adjacent to the first side of the second pixel.

5. The pixel arrangement structure for an organic light emitting diode display of claim 4, wherein a third side of the third pixel facing one side of the first pixel is longer than a fourth side of the third pixel adjacent to the third side of the third pixel.

6. The pixel arrangement structure for an organic light emitting diode display of claim 5, wherein the second pixel and the third pixel are alternately arranged with respect to the first pixel so as to surround the first pixel.

7. The pixel arrangement structure for an organic light emitting diode display of claim 6, wherein the first pixel has a hexagonal shape and the second pixel and the third pixel have hexagonal shapes symmetrical with respect to each other.

8. The pixel arrangement structure for an organic light emitting diode display of claim 6, wherein the first pixel has a hexagonal shape and the second pixel and the third pixel have pentagonal shapes symmetrical with respect to each other.

9. The pixel arrangement structure for an organic light emitting diode display of claim 8, wherein:
    the first pixel, the second pixel and the third pixel are provided in plural;
    the second pixel and the third pixel are positioned between adjacent first pixels arranged on a first imaginary line; and
    a portion of each of the second pixel and the third pixel is positioned between the adjacent first pixels arranged on a second imaginary line crossing the first imaginary line.

10. The pixel arrangement structure for an organic light emitting diode display of claim 1, wherein the first pixel, the second pixel and the third pixel are arranged in a triangular shape.

* * * * *